United States Patent
Yach et al.

(10) Patent No.: US 6,593,639 B2
(45) Date of Patent: *Jul. 15, 2003

(54) LAYOUT TECHNIQUE FOR A CAPACITOR ARRAY USING CONTINUOUS UPPER ELECTRODES

(75) Inventors: Randy L. Yach, Phoenix, AZ (US); Igor Wojewoda, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 5 days.

This patent is subject to a terminal disclaimer.

(21) Appl. No.: 09/846,018

(22) Filed: Apr. 30, 2001

(65) Prior Publication Data

US 2001/0017383 A1 Aug. 30, 2001

Related U.S. Application Data

(63) Continuation of application No. 09/221,634, filed on Dec. 23, 1998, now Pat. No. 6,225,678.

(51) Int. Cl.[7] .............................................. H01L 29/00
(52) U.S. Cl. ........................................ 257/532; 257/750
(58) Field of Search ................................. 257/532, 535, 257/750, 300, 306, 307, 308, 309, 310; 361/301.1, 303, 313, 322, 328, 329, 330

(56) References Cited

U.S. PATENT DOCUMENTS

| | | | | |
|---|---|---|---|---|
| 3,714,530 A | * | 1/1973 | Wells et al. ................ 317/261 |
| 3,745,508 A | * | 7/1973 | Bruder et al. ............... 338/320 |
| 4,333,022 A | * | 6/1982 | Whelan et al. ............. 307/304 |
| 5,140,327 A | | 8/1992 | Bruce et al. ................ 341/172 |
| 5,195,017 A | * | 3/1993 | McDonald .................. 361/313 |
| 5,406,447 A | * | 4/1995 | Miyazaki .................... 301/313 |
| 5,920,453 A | * | 7/1999 | Evans et al. ................ 361/303 |
| 5,952,952 A | * | 9/1999 | Choi et al. .................. 341/172 |
| 6,157,045 A | * | 12/2000 | Shimomura .................. 257/48 |
| 6,225,678 B1 | * | 5/2001 | Yach et al. ................. 257/532 |
| 6,246,075 B1 | * | 6/2001 | Su et al. ....................... 257/48 |
| 6,277,436 B1 | * | 8/2001 | Stauf et al. .............. 427/126.3 |

OTHER PUBLICATIONS

L.M. Arzubi et al., "Metal–Oxide Semiconductor Capacitor," IBM Technical Disclosure Bulletin, vol. 17, No. 6, pp. 1569–1570.

* cited by examiner

*Primary Examiner*—Sara Crane
(74) *Attorney, Agent, or Firm*—Baker Botts L.L.P.

(57) ABSTRACT

A matching capacitor array is implemented on a single, monolithic integrated circuit. The array features a matrix of bottom electrodes and a plurality of continuous top electrode strips, where each continuous top electrode strip spans numerous bottom electrodes. The conductive contacts for each continuous top electrode strip are removed from the capacitor interface to the terminal ends of each of the continuous top electrode strips. The invention seeks to match or control parasitic and fringe capacitance, rather than to eliminate or minimize such capacitances. By creating a matched array, the parasitic and fringe capacitances of each matching capacitor unit cell are incorporated into the total capacitance of the unit cell.

10 Claims, 7 Drawing Sheets

LAYOUT TECHNIQUE FOR A CAPACITOR ARRAY USING CONTINUOUS UPPER ELECTRODES

This application is a continuation of application Ser. No. 09/221,634, filed Dec. 23, 1998, now U.S. Pat. No. 6,225,678.

BACKGROUND OF THE INVENTION

1. Field of the Invention

This invention relates generally to the fabrication of capacitors on semiconductor devices. Specifically this invention identifies a new layout technique for fabricating an array of matched capacitors on semiconductor devices using a continuous top electrode.

2. Description of the Related Art

The matching of capacitors is defined as the relative size and capacitance (in farads) of the capacitors in the array with respect to each other. Matching also requires that parasitic effects, i.e. cross-talk between capacitors and fringe capacitance, i.e. capacitance beyond the interface of the electrodes, be minimized. In the alternative, matching may be accomplished by providing for equal distribution of the parasitics amongst the array. There are many integrated circuit applications that require a capacitor array that is accurately matched. One such application is for use with a Successive Approximation Register in an Analog to Digital Converter, shown in FIG. 1 as a simple 4-bit register, capacitor array and comparator.

As shown in FIG. 2, which is a cross section of a typical capacitor array layout under the prior art, each top conductive electrode corresponds to a bottom conductive electrode. The parasitic capacitance components as between the top and bottom electrodes and the substrate may be significant. Also significant are the crosstalk effects as between adjacent capacitors and fringe capacitance which occurs beyond the active area of the capacitor electrodes.

In the prior art, excessive silicon area is required by the alignment and process rules of fabricating a capacitor array where both the top and bottom electrodes are unit cells. Also, increasing the spacing between the individual conductive electrode pairs can serve to offset the deleterious effects of parasitic and crosstalk capacitance. However, the additional spacing requires a larger silicon area which then exposes the array to greater process variations. This may lead to even greater difficulty in matching the array.

Another problem in creating a matched capacitor array is that the last row or column of capacitors will function differently because it is bordered only on one side by other unit capacitors. Typical prior art capacitor arrays solve this problem by surrounding the periphery of the array with "dummy" or unused rows of unit capacitors. The dummy rows are used to address process sensitivities, by surrounding each capacitor with similar features to assist in uniform etching. In the prior art, both the bottom and top electrodes of the dummy capacitor rows are grounded, i.e. not connected to the active array.

However, even with such prior art techniques as described above, significant parasitic and crosstalk capacitance remains as well as non-efficient use of semiconductor "real estate" or area. Thus, a need exists to provide for an improved layout of capacitors on an integrated circuit where the matching of the capacitors and the use of the silicon area are optimized

BRIEF SUMMARY OF THE INVENTION

It is an object of the present invention to provide an improved layout technique for a capacitor array on an integrated circuit.

It is another object of the present invention to provide and improved layout technique for a capacitor array on an integrated circuit where the matching of capacitors is optimized.

It is another object of the present invention to provide an improved layout technique for a capacitor array on an integrated circuit where rather than minimizing the parasitic and fringe capacitances of the unit cells in the array, the parasitic and fringe capacitances are incorporated into the total capacitance of each of the unit cells in the array and the parasitic and fringe capacitances of each unit cell are designed to be approximately equal.

It is another object of the present invention to provide an improved layout technique for a capacitor array on an integrated circuit which optimizes the use of semiconductor area.

It is another object of the present invention to provide an improved layout technique for a capacitor array on an integrated circuit which minimizes the number of masks required for fabrication.

It is another object of the present invention to provide an improved layout technique for a capacitor array on an integrated circuit which matches the parasitic and fringe capacitances as between unit capacitors.

In accordance with one embodiment of the present invention, a matching capacitor array comprises a plurality of bottom electrodes arranged in a matrix of N rows and M columns, a dielectric layer coupled to the plurality of bottom electrodes, and a plurality of top electrodes arranged as M columns coupled to the dielectric layer. Each of the plurality of top electrode columns coincides with the plurality of bottom electrode M columns. Each of the plurality of top electrode columns spans the N rows of the plurality of bottom electrodes. The matching capacitor array is implemented on a single, monolithic integrated circuit.

The matching capacitor array is comprised of matching capacitor unit cells, each cell may be seen to comprise a bottom electrode; a dielectric material coupled to the bottom electrode; a portion of a continuous top electrode coupled to the dielectric layer wherein the continuous top electrode spans a plurality of the bottom electrodes where each of the bottom electrodes are geometrically and electrically identical. The matching capacitor unit cell is implemented on a single, monolithic integrated circuit.

The foregoing and other objects, features, and advantages of the invention will be apparent from the following, more particular, description of the preferred embodiments of the invention, as illustrated in the accompanying drawings.

DETAILED DESCRIPTION OF THE INVENTION

Figure 4:
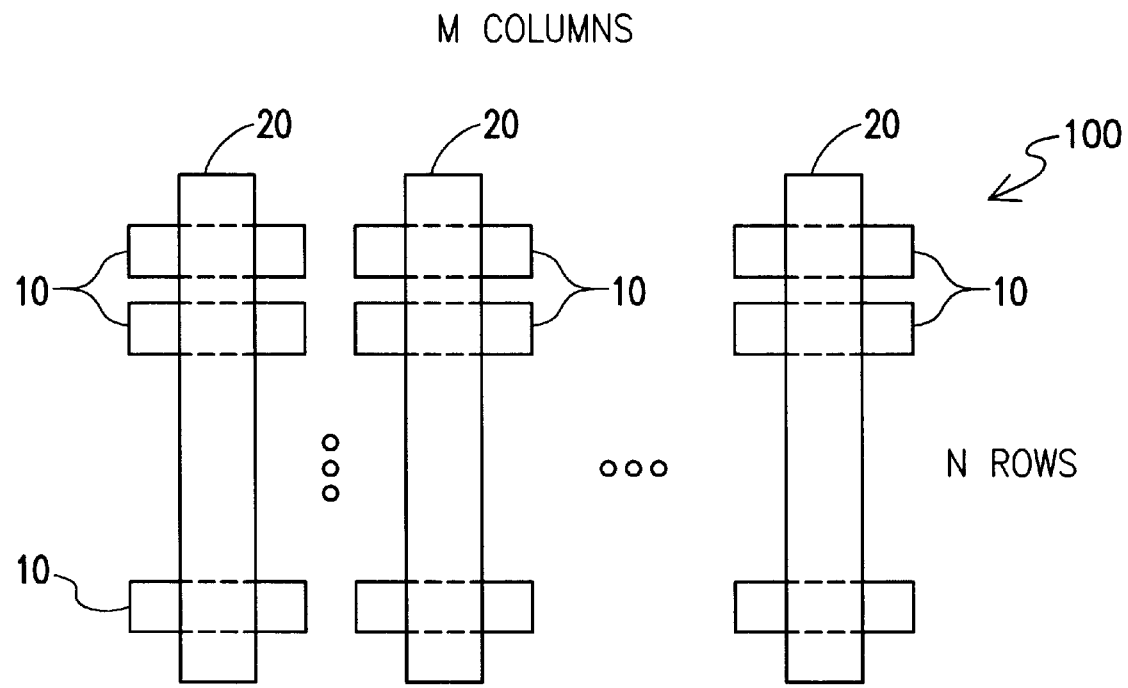
FIG. 4 is a simplified top view of the present invention illustrating the geometry of the bottom and top electrodes and the unit cell.

Referring to FIG. 4, a improved layout technique for a matching capacitor array 100 is shown in simplified terms. It should be noted that none of the figures with respect to the present invention are intended to demonstrate an accurate scale as between elements of the capacitors or layers of the semiconductor process. As to the contrary, in many occasions the scale of the semiconductor process steps is specifically distorted so as to illustrate the key features of the invention.

The improved layout technique for a matched capacitor array comprises a matrix of bottom electrodes or plates (polysilicon 1) 10 in the form of N rows and M columns. The array further comprises a plurality of continuous top electrodes or plates (polysilicon 2) 20 in the form of continuous columns or strips, i.e. M columns to coincide with the number of columns within the bottom electrode matrix. Each continuous top electrode column 20 spans all the rows of the bottom electrodes 10. An alternate embodiment would simply rotate the embodiment in FIG. 4 by 90 degrees, thereby turning a row into a column and vice versa.

The bottom electrodes 10 are deposited on a silicon substrate (not shown). Photolithographic and etching techniques known to those skilled in the art of semiconductor fabrication are employed to create the polysilicon patterns for the bottom 10 and continuous top electrodes strips 20 shown in FIG. 4.

A dielectric layer (not shown) consisting of silicon dioxide, silicon nitride, a combination of silicon dioxide and silicon nitride (e.g. CNO layer) or other non-conductive material is deposited over the bottom electrodes 10 of the poly 1 layer. The poly 2 layer is deposited on the dielectric layer. The continuous top electrode columns 20 are then etched from the poly 2 layer to form the pattern illustrated. In she preferred embodiment, there is a protective oxide layer (not shown) grown over the continuous top electrode columns 20. Also, there is at least one metal interconnect layer deposited over the electrode and dielectric layers.

In an alternative process, the substrate is doped to provide an electrode (i.e. active region) in place of the poly 1 layer noted above. In this embodiment, only a single layer of polysilicon (or optionally metal) is required to form the second or continuous top electrode columns of the capacitor.

In still another process, the fabrication process may substitute metal for polysilicon for the bottom 10 and top 20 electrodes and remain within the scope of the invention.

Figure 4A:
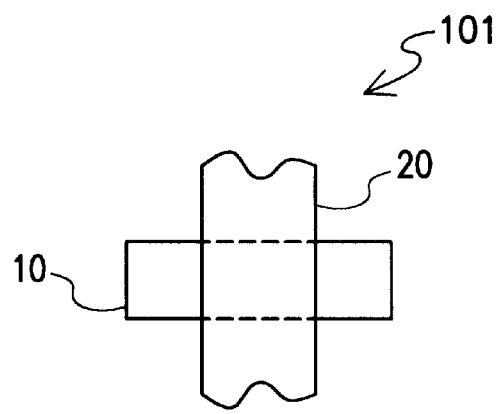
FIG. 4A is a simplified top view of a unit cell within the matching capacitor array of the present invention.

Referring to FIG. 4A, wherein like numerals represent like elements, a matching capacitor unit cell 101 which is comprised of a bottom electrode 10, a portion of the continuous top electrode 20 and the intervening dielectric layer (not shown). Note that the bottom electrode 10 is slightly offset from the centerline of the continuous top electrode 20. The offset is to provide a suitable site at the bottom electrode 10 for the conductive contacts described below. Each matching capacitor unit cell 101 is matched with the other unit cells in the array 100 with respect to total capacitance. The total capacitance includes the intended capacitance as created by the interface of the bottom 10 and continuous top 20 electrodes as well as the parasitic and fringe capacitances including cross talk.

Figure 5:
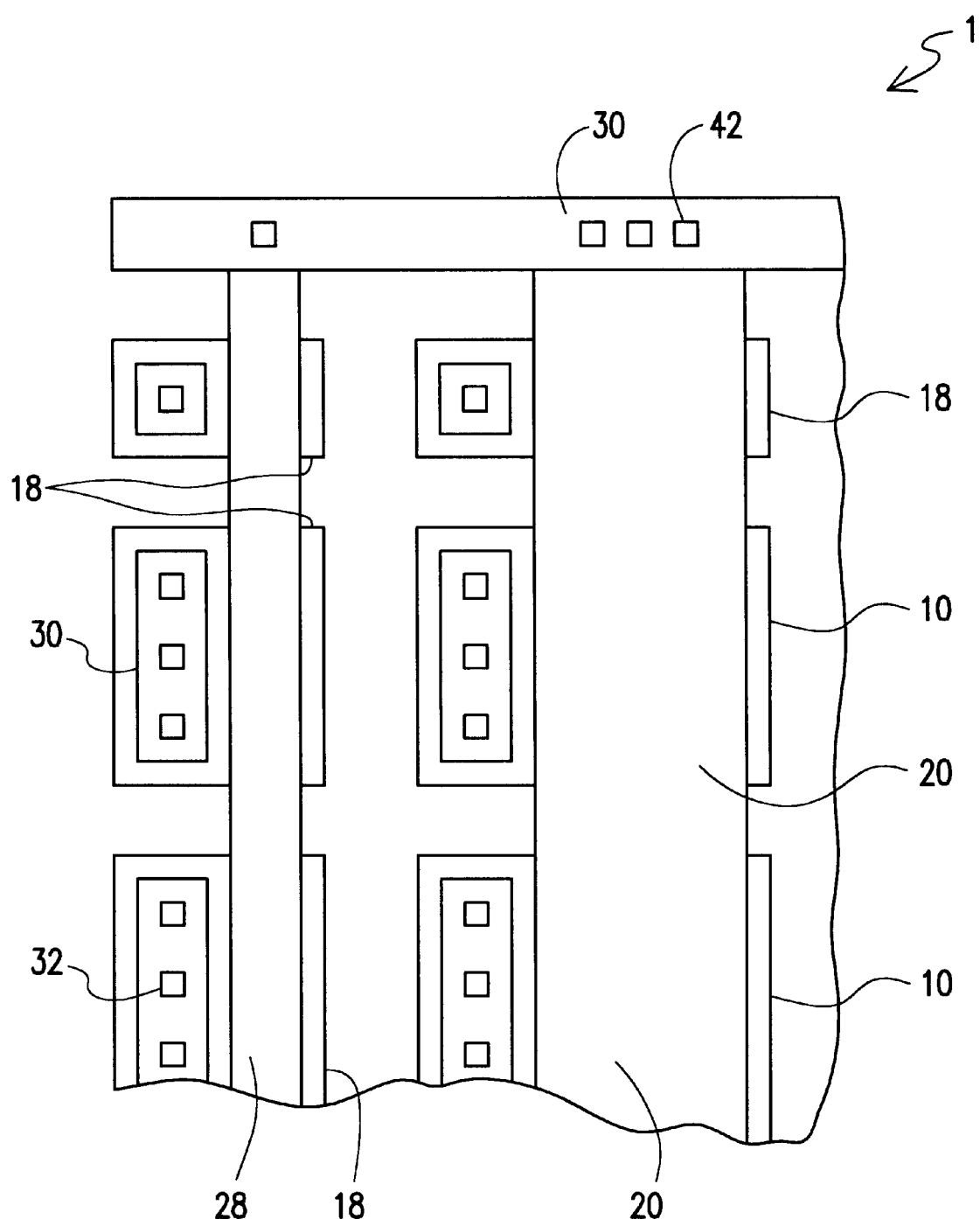
FIG. 5 is another top view of the present invention showing the relationship of the conductive contacts and metal pattern layers to the bottom and top electrodes.

FIG. 5, wherein like numerals represent like elements, illustrates a more detailed representation of a portion of the matched capacitor array 100. Shown in the diagram are a set of conductive contacts 32 as between the bottom electrodes 10 and a metal 1 layer 30 and a second set of conductive contacts 42 as between the continuous strips of the top electrodes 20 and the metal 1 layer 30. The improved layout technique allows for the continuous Lop electrode conductive contacts 42 to be positioned at the terminal end of each continuous top electrode 20. This technique removes the conductive contacts 42 away from the capacitor interfaces which results in several beneficial effects which are resented in the discussion of FIGS. 6A and 6B.

Note that only one metal layer 30 is required to interconnect the continuous top electrodes 20 as well as to program an interconnect network for the bottom electrodes 10. This improvement is distinguishable from the prior art, which required at least two metal layers to achieve the same result. The implementation of this feature is discussed in greater detail below.

In an alternative embodiment, the continuous top electrodes may be fabricated as a single plate rather than as columns or strips. The continuous single top electrode would span the entire matrix of bottom electrodes 10 and 18. Thus, no additional interconnect in a separate metal layer would be required for the continuous single top electrode. However, fabrication would require the creation of apertures in the continuous single top electrode for conductive contacts to interconnect the matrix of bottom electrodes.

Also shown in FIG. 5 are border capacitors that surround the perimeter of the array 100, which are comprised of the perimeter bottom electrodes 18 and perimeter continuous top electrodes 28 and perimeter portions of the continuous top electrodes 20. These border capacitors, provide a similar, but superior function, as compared to the dummy capacitors found in the prior art. The border capacitors provide geometrical or physical matching for the outer capacitors of the active array in a similar manner as in the prior art. The border capacitors also provide electrical matching for the outer capacitors of the active array, which is not the case in the prior art.

The geometrical or physical matching function of the border capacitors can be understood using cross talk as an example. The active unit capacitors within the interior of the array all have adjacent capacitors with which there is parasitic capacitance in the form of cross talk between capacitors. However, if not for the border capacitors, the outer capacitors in the active array would be deplete of the perimeter cross talk and therefore would not be matched to the interior capacitors. By providing an outer perimeter of border capacitors, not part of the active array, the cross talk effects are matched equally for the outer capacitors as for the interior capacitors of the active array. Thus, the goal of the present invention is not to reduce, minimize or eliminate parasitic capacitance, as in the prior art, but to control parasitic capacitance, such as cross talk. By controlling parasitic capacitance and ultimately including parasitic capacitance as part of the total capacitance of the matching capacitor unit cell, a matched capacitor array 100 is more efficiently achieved.

The method for electrical matching of capacitors may also be distinguished from the prior art. In prior capacitors arrays, both electrodes of the dummy capacitors were set to ground potential. The purpose of grounding the dummy electrodes was seen as necessary for minimizing the parasitic capacitance of the array. However, the unforeseen result of this technique was an electrical mismatch of the outer capacitors in the active array, i.e. those adjacent to the dummy capacitors, with the remaining interior capacitors of the active array.

Figure 1:
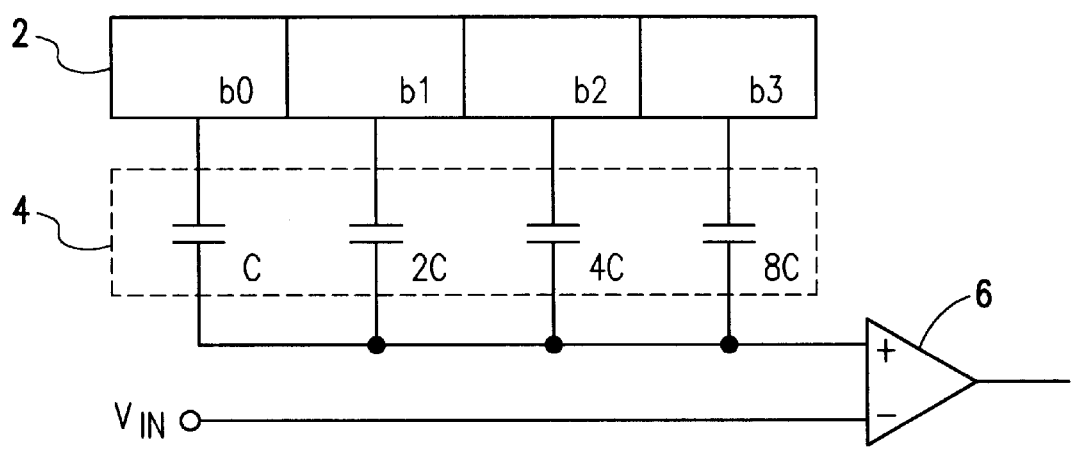
FIG. 1 is a schematic view of a capacitor array used with a successive approximation register for analog to digital conversion.
Figure 2:
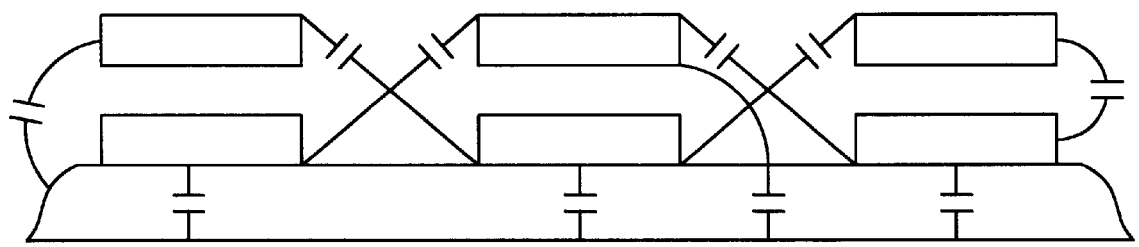
FIG. 2 is a cross section view of the prior art illustrating parasitic and fringe capacitances.

In the present invention, electrical matching of the array 100 is enhanced by grounding only the bottom electrodes 18 of the border capacitors. The continuous top electrodes 28 of the border capacitors are typically connected to the continuous top electrodes 20 of the active array (e.g. the common capacitive node as shown in FIG. 1), thus making the border capacitors electrically similar to the capacitors in the active array.

Figure 3:
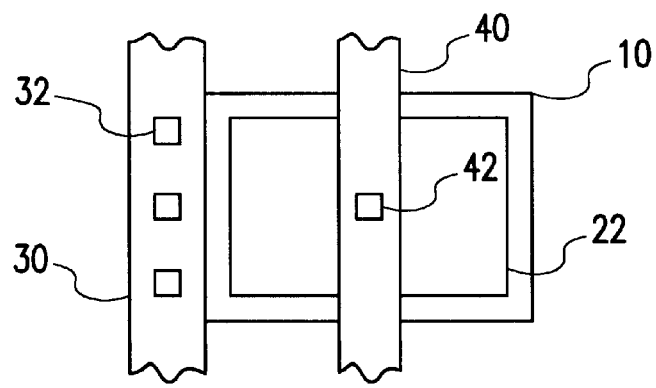
FIG. 3 is a top view of a prior art unit capacitor illustrating the relationship of the conductive contacts and metal pattern layers to the bottom and top electrodes.
Figure 6A:
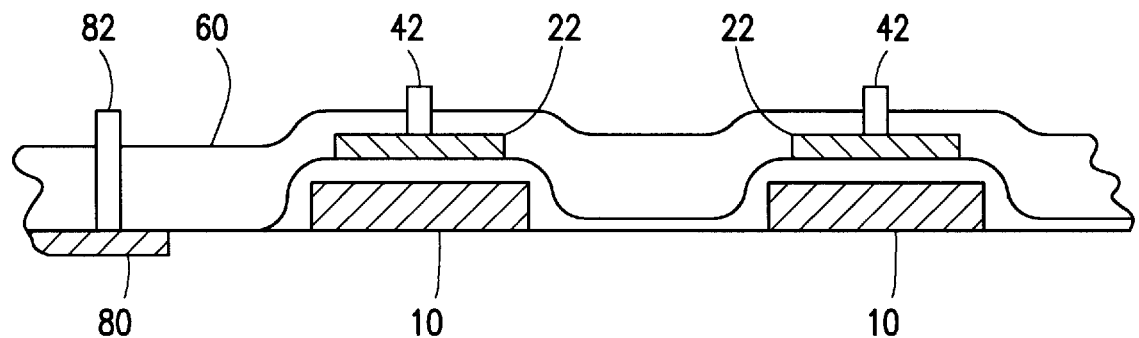
FIG. 6A is a cross section view of the prior art illustrating the problems associated with conductive contacts to the top electrode.

Referring to the prior art as shown in FIGS. 3 and 6A, wherein like numerals represent like elements, the conductive contacts 42 for the top electrodes 22 were positioned at the capacitor interface, i.e. in the center of the top electrode 22 and directly over the bottom electrode 10. As shown in FIG. 6A, the thickness of the protective oxide layer 60 above the top electrode 22 was typically less than the thickness of the oxide layer 60 in other doped active regions 80 of the device connected to the capacitor array. Thus, more etching of a thicker oxide 60 over an active region 80 was required to make contact as opposed to the thinner oxide 60 over the top electrodes 22.

Because the entire device is simultaneously subject to the etching process, when etching the protective oxide layer 60 to form the conductive contacts 42, there occurred thinning or burrowing of the top electrodes 22 in achieving the proper contact. Character zed as mechanical stress, this thinning of the poly 2 top electrodes 22 can result in undesirable consequences such as pitting of the top electrode 22, which results in poor contact, to actual cracking of the top electrode 22 in the extreme case.

Figure 6B:
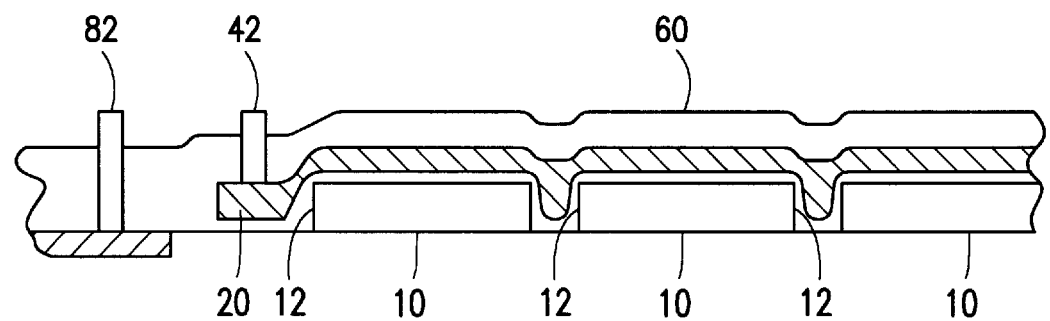
FIG. 6B is a cross section view of the present invention illustrating the conformal nature of the continuous top electrode.

Referring to FIG. 6B, wherein like numerals represent like elements, the present invention demonstrates the conformal nature of the poly 2 continuous top electrode 20 in relation to the poly 1 bottom electrodes 10. The conductive contacts 42 are made at the terminal end of the continuous top electrode columns 20 where the poly 2 layer is much closer to the substrate 5 than in the prior art. The result of this approach is that the protective oxide layer 60 is nearly planer at the point of the conductive contacts 42, for the poly 2 continuous top electrode column 20, and the conductive contacts 82, for other doped active regions 80 of the device. By having a nearly planar oxide layer 60, the etching parameters for the conductive contacts 42 and 82 are nearly identical, thus precluding mechanical stress to the poly 2 continuous top electrode column 20 of the capacitor array.

Furthermore, disregarding the advantages of the planar nature of the oxide layer 60 momentarily, the conductive contacts 42 in the present invention are removed from the capacitor interface. Thus, by relocating the conductive contacts 42 to the terminal ends of the continuous top electrode columns 20, any residual mechanical stress incurred by the etching process is not relevant to the performance of the capacitor.

Additionally, the conformal nature of the continuous top electrode 20 in relation to the bottom electrode 10 allows the matching capacitor unit cell to utilize sidewall capacitance as part of the total capacitance. Sidewall capacitance is defined as the capacitance between the continuous top electrode 20 and the sidewalls 12 of the bottom electrode 10. This technique allows the matched capacitor unit cell itself to be made smaller because there is maximum utilization of the capacitive potential of the electrodes 10 and 20.

Furthermore, the present invention provides for incorporating parasitic capacitance into the total capacitance of the matching capacitor unit cell. This incorporation of parasitic capacitance improves the design rules for fabrication by allowing the matching capacitor unit cells to be placed closer together than in the prior art as illustrated by comparing the proximity of the bottom electrodes 10 shown in FIG. 6B to those of FIG. 6A. The end result is an optimization of silicon area as compared to prior art arrays which sought to minimize parasitic capacitance.

Figure 7A:
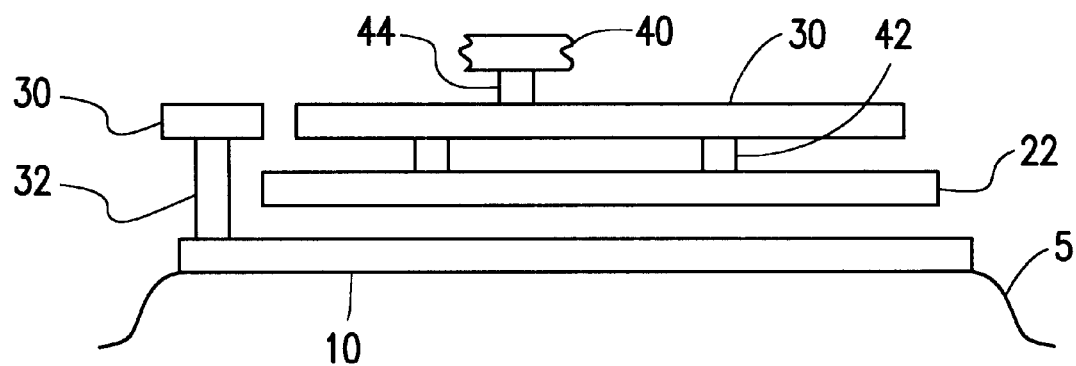
FIG. 7A is a cross section view of the prior art at the capacitor interface illustrating two independent metal layers of interconnect.
Figure 7B:
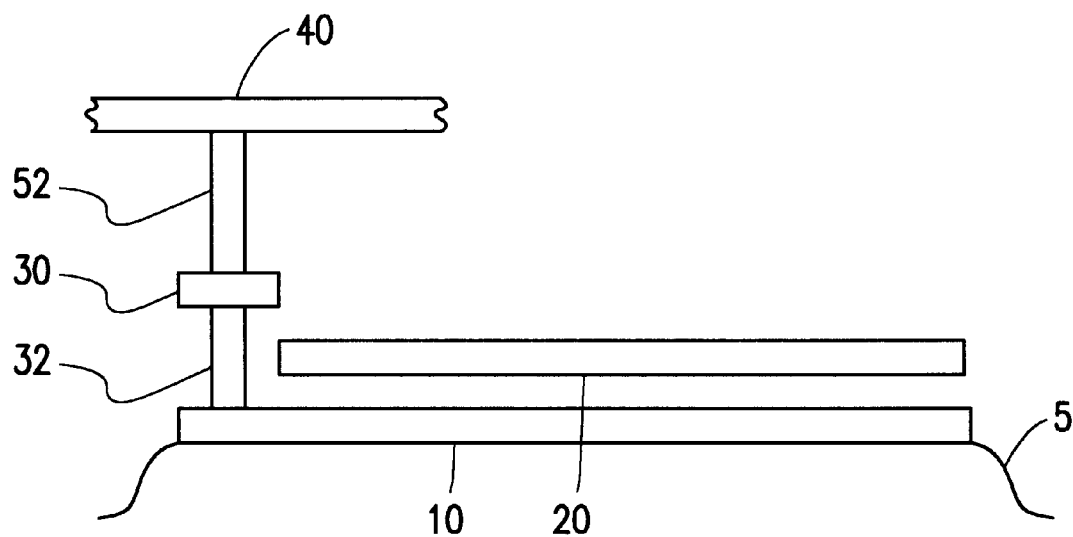
FIG. 7B is a cross section view of the present invention at the capacitor interface illustrating optional interconnect methods.
Figure 8A:
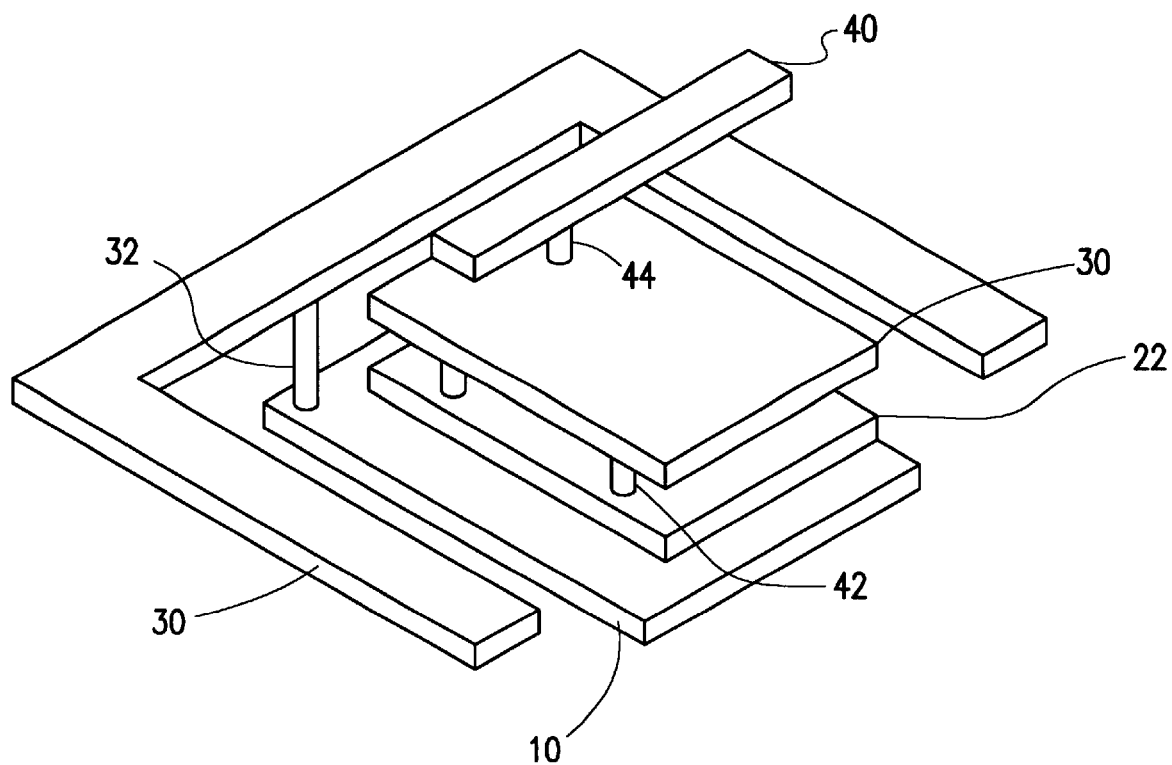
FIG. 8A is a three dimensional view of the prior art unit cell.

Referring to FIGS. 7A, 7B, 8A, 8B and 8C, wherein like numerals represent like elements, the interconnect of the improved layout technique for a matched capacitor array 100 is simplified over the prior art. In the prior art, two metal layers for interconnect are shown in FIGS. 7A and 8A. Conductive contacts 32 connect the poly 1 bottom electrodes 10 and the metal 1 layer 30. Typically, more than one conductive contact 32 exists for each matching capacitor unit cell to provide adequate conductivity.

In the prior art, the bottom 10 and top 22 electrodes required orthogonal, and thus independent routing of thin interconnect. Therefore, the bottom 10 and top 22 electrodes could not share a common metal layer for interconnect and a metal 2 layer 40 was required. A first set of top electrode conductive contacts 42 connected the top electrode 22 with the metal 1 layer 30. A second set of conductive contacts 44 were needed as between the metal 1 layer 30 and the metal 2 layer 40.

Also, in the prior art, programming of the bottom electrodes 10, i.e. interconnect networks of the poly 1 bottom electrodes 10 in groups, was implemented in metal 1 layer 30. Programming in the metal 1 layer 30 was undesirable because of the close proximity to the substrate 5 which resulted in increased differential programming capacitance, i.e. spurious capacitance between the metal interconnects for programming and other elements such as the substrate 5.

Figure 8B:
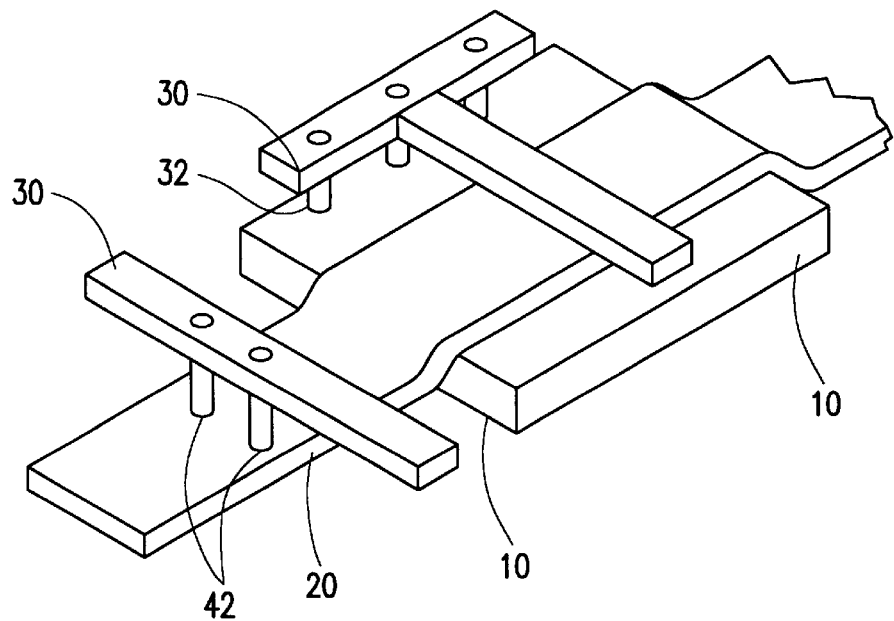
FIG. 8B is a three dimensional view of the present invention with bottom electrode programming in the metal 1 layer.

Referring to FIGS. 7B and 8B (shown without border capacitors), the present invention permits the bottom electrodes 10 and the continuous top electrodes 20 to share a common metal layer for interconnect. Sharing a common metal layer is made possible because rather than having individual top electrodes 22 which must be subsequently interconnected as in the prior art, the continuous top electrodes 20 in the present invention are a continuous strip of polysilicon 2. The interconnect for the continuous top electrodes 20, i.e. conductive contacts 42 and metal 1 layer 30 occurs at the terminal ends of the continuous top electrode columns 20 and thus outside of the active area of the capacitor array illustrated in FIG. 8B.

Figure 8C:
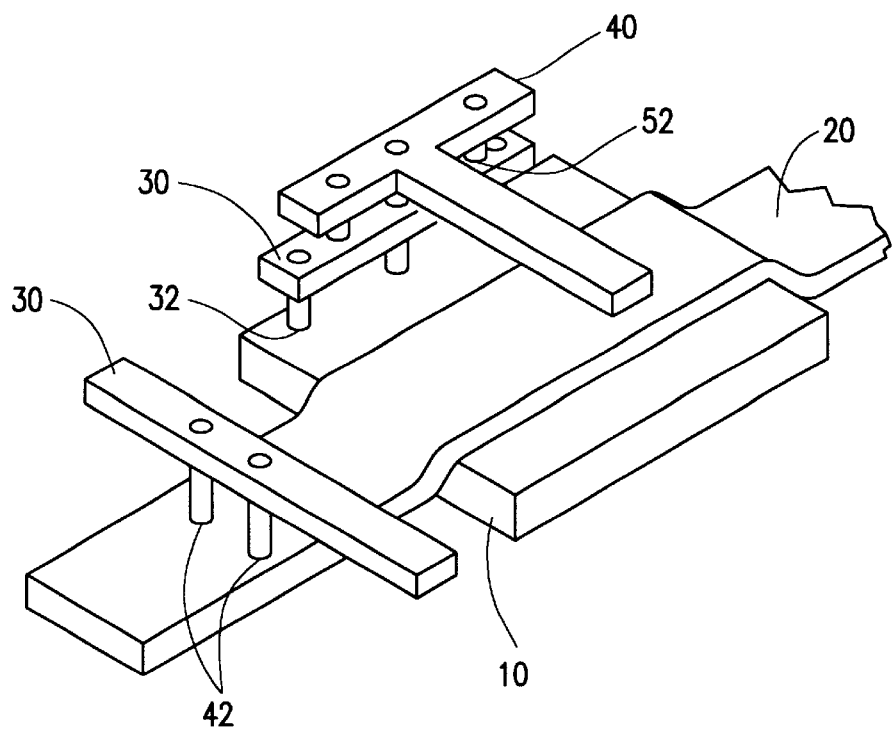
FIG. 8C is a three dimensional view of the present invention with bottom electrode programming in the metal 2 layer.

Thus, the metal 1 layer 30 may serve two purposes. As to the bottom electrodes 10, the metal 1 layer 30 may serve either to interconnect the bottom electrodes 10 with each other by means of conductive contacts 32 to program the required capacitive elements for connected circuitry such as the successive approximation register. Alternatively, as shown in FIG. 8C (shown without border capacitors), the metal 1 layer in the present invention serves as a bridge to connect the bottom electrodes 10 with the programming metal 2 layer 40 by means of the conductive contacts 32 and vias 52.

Thus, the programming of the bottom electrodes 10 may be accomplished in the metal 1 layer 30 or in the metal 2 layer 40, if available. The benefits of programming in the metal 1 layer 30 are a simpler process and lower cost. The benefits of programming in the metal 2 layer 40 are reduced differential programming capacitance.

As to the continuous top electrode columns 20, the metal 1 layer 30 may serve to interconnect the continuous top electrode columns 20 to a common node at the terminal end of each of the top electrode strips 20 by means of the conductive contacts 42. Thus, the improved layout technique of the present invention provides for a simpler, more cost efficient process, by removing the requirement for at least one metal interconnect layer for comparable layouts with the prior art.

The concepts employed by the present invention of continuous top electrode columns 20 include seeking to match parasitic capacitances rather than striving to minimize them as in the prior art, incorporating the parasitic capacitances as part of the total capacitance of the matching capacitor unit cell and electrically matching the border capacitors with the active array have yielded certain desirable results.

The improved layout technique for a matching capacitor array 100 (FIGS. 4 and 5) allows for minimum space between the matching capacitor unit cells, thus requiring less silicon area and saving cost. Minimum space between the matching capacitor unit cells is afforded because the present invention seeks to leverage parasitic capacitances into the total capacitance of the matching capacitor unit cell rather than to eliminate or minimize parasitic capacitance as in the prior art.

The improved layout technique for a matching capacitor array 100 (FIGS. 4 and 5) removes the contacts and/or vias from directly above the capacitor which eliminates mechanical stress. By removing the mechanical stress associated with etching for a conductive contact at the capacitor interface and relocating the conductive contact to a non-critical portion of the array, capacitor matching is improved and a more reliable capacitor array is achieved.

In the present invention, parasitic capacitance between the matching capacitor unit cells are now used as part of the unit cell. This allows the design rules for fabrication to permit closer proximity of the matching capacitor unit cells which results in an optimizition of silicon area. Also, the conformal nature of the continuous top electrode provides for a smaller matching capacitor unit cell as compared to the prior art for a similar capacitance because the sidewall capacitance are factored into the total capacitance of each of the cells.

Although the invention has been particularly shown and described with reference to a preferred embodiment thereof, it will be understood by those skilled in the art that changes in form and detail may be made therein without departing from the spirit and scope of the invention.

What is claimed is:

1. A m cling capacitor array comprising:
    a plurality of bottom electrodes arranged in a matrix of N rows and M columns;
    a dielectric layer co led to the plurality of bottom electrodes; and
    a plurality of continuous top electrodes arranged as M columns coupled to the dielectric layer;
    wherein each of the plurality of continuous top electrodes arranged as M columns spans the N rows of the plurality of bottom electrodes;
    wherein each of th plurality of bottom electrodes is offset from a centerline of respective ones of the plurality of continuous top electrodes; and
    wherein the match ng capacitor array is implemented on a single, monolithic integrated circuit.

2. The array in accordance with claim 1 wherein the plurality of bottom electrodes and the plurality of continuous top electrodes form the active capacitor array.

3. The array in accordance with claim 2 further comprising:
    border capacitors surrounding a perimeter of the active capacitor array;
    wherein the border capacitors are geometrically matched to the active capacitor array.

4. The array in accordance with claim 2 further comprising:
    border capacitors surrounding a perimeter of the active capacitor array;
    wherein the border capacitors are electrically matched to the active capacitor array.

5. The array in accordance with claim 1 further comprising:
    a metal interconnect layer;
    at least one conductive contact for each bottom electrode wherein the at least one conductive contact couples the bottom electrode to the metal interconnect layer.

6. The array in accordance with claim 5 further comprising:
    a second at least one conductive contact located exclusively at each terminal end of each of the continuous top electrodes;
    wherein the second at least one conductive contact couples the continuous top electrodes to the metal interconnect layer.

7. The array in accordance with claim 6 wherein the plurality of continuous top electrodes are coupled to a common node.

8. The array in accordance with claim 4 wherein a metal layer serves as an interconnect programming network for the plurality of bottom electrodes.

9. The array in accordance with claim 4 further comprising:
    a second metal layer; and
    a second at least one conductive contact;
    wherein the second at least one conductive contact couples the plurality of bottom electrodes to the second metal layer.

10. Th array in accordance with claim 9 wherein the second metal layer serves as an interconnect programming network for the plurality of bottom electrodes.

* * * * *